United States Patent [19]

Bowman

[11] Patent Number: 5,247,253
[45] Date of Patent: Sep. 21, 1993

[54] EDDY CURRENT PROXIMITY SENSING MEANS AND METHOD USEFUL FOR DETERMINING THROTTLE POSITION

[75] Inventor: Scott A. Bowman, San Anselmo, Calif.

[73] Assignee: Curtis Instruments, Inc., Mt. Kisco, N.Y.

[21] Appl. No.: 611,073

[22] Filed: Nov. 9, 1990

[51] Int. Cl.$^5$ .............................................. G01B 7/14
[52] U.S. Cl. ........................... 324/207.12; 324/225; 324/207.16
[58] Field of Search ............... 324/207.16, 207.18, 324/207.19, 207.24, 207.12, 224, 225, 222

[56] References Cited

U.S. PATENT DOCUMENTS

| | | | |
|---|---|---|---|
| 3,926,053 | 12/1975 | Schurrer et al. | 324/207.12 X |
| 4,502,006 | 2/1985 | Goodwin et al. | 324/207.16 |
| 4,779,048 | 10/1988 | Aichele | 324/207.18 |
| 4,797,614 | 1/1989 | Nelson | 324/224 X |
| 4,950,985 | 8/1990 | Voss et al. | 324/207.16 |

*Primary Examiner*—Gerard R. Strecker
*Assistant Examiner*—Warren S. Edmonds
*Attorney, Agent, or Firm*—John H. Crozier

[57] ABSTRACT

In a preferred embodiment, an inductor excited by a square-wave alternating current to produce a magnetic field in the inductor. A member movable in proximity to the inductor causes losses in the magnetic energy, which losses are directly related to the position of the member with respect to the coil. In another aspect of the invention, there is provided an inductor excited by an alternating current and a moving member which includes a ferromagnetic core having disposed thereon a thin sleeve of high resistivity material. In a further aspect of the invention, there is provided an inductor excited by an alternating current and a moving member, the excitation circuit including an oscillator having a positive temperature coefficient of frequency.

15 Claims, 3 Drawing Sheets

EDDY CURRENT PROXIMITY SENSING MEANS AND METHOD USEFUL FOR DETERMINING THROTTLE POSITION

BACKGROUND OF THE INVENTION

1. Field of the Invention

This invention relates to proximity sensing generally and, more particularly, to novel proximity sensing means and method which are highly accurate and which are simple, reliable, and temperature compensated.

2. Background Art

While the present invention has numerous applications, it is especially well suited for use as a throttle position sensor for electrically powered mobile equipment. It will be understood by those skilled in the art that the present invention may be used in numerous applications in which there are requirements for accurate position sensing.

In many such applications, throttle position is determined through the use of a potbox which includes a mechanical sliding contact. Such a potbox suffers from the disadvantages of having a mechanical contact which is subject to wear and to the introduction of inaccuracies due to mechanical abuse and dirty and abrasive atmospheres.

In other such applications, the position sensor relies on a Hall effect device responsive to the proximity of a magnetic structure. This type of sensor has the disadvantages of being complicated, it requires a permanent magnet, and it tends to be temperature dependent.

Accordingly, it is a principal object of the present invention to provide proximity sensing means and method which are accurate and which do not rely on mechanically contacting surfaces.

Another object of the invention is to provide such means and method which can provide position sensing in dirty and abrasive atmospheres.

An additional object of the invention is to provide such means and method which are highly accurate, yet are simple and economical to manufacture.

It is another object of the present invention to provide such means and method which are temperature self compensating.

Other objects of the invention, as well as particular features and advantages thereof, will, in part, be apparent and will, in part, be obvious from the following description and the accompanying drawing figures.

SUMMARY OF THE INVENTION

The present invention accomplishes the above objects, among others, by providing, in a preferred embodiment, an inductor excited by a square-wave alternating current to produce a magnetic field in the inductor. A member movable in proximity to the inductor causes losses in the magnetic energy, which losses are directly related to the position of the member with respect to the coil. In another aspect of the invention, there is provided an inductor excited by an alternating current and a moving member which includes a ferromagnetic core having disposed thereon a thin sleeve of high resistivity material. In a further aspect of the invention, there is provided an inductor excited by an alternating current and a moving member, the excitation circuit including an oscillator having a positive temperature coefficient of frequency.

BRIEF DESCRIPTION OF THE DRAWING

Understanding of the present invention will be facilitated by reference to the Drawing, in which.

DETAILED DESCRIPTION OF THE PREFERRED EMBODIMENTS

Figure 1:
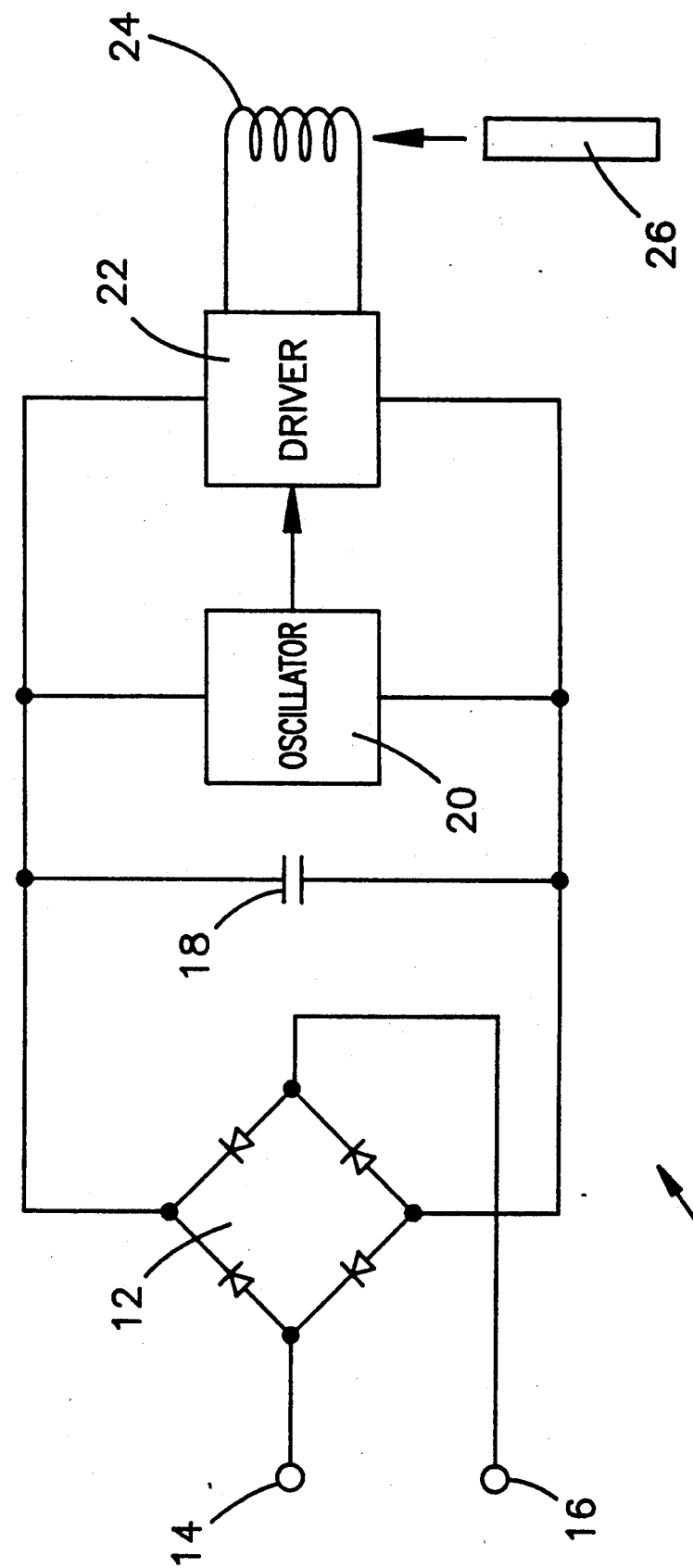
FIG. 1 a block diagram of a proximity sensor according to the present invention.

Referring now to the Drawing, on which the same or similar elements are given consistent identifying numerals throughout the various figures thereof, there is illustrated, on FIG. 1, a proximity sensor, generally indicated by the reference numeral 10, having as major elements thereof a diode bridge 12 connected to input/output terminals 14 and 16 for connection to a motor controller (not shown), a capacitor 18 connected across the output from the diode bridge, an oscillator 20 connected to the terminals and connected to a driver 22, and a sensing coil 24 connected to the output of the driver. A plunger 26 is movably disposed in proximity to coil 24.

Figure 2:
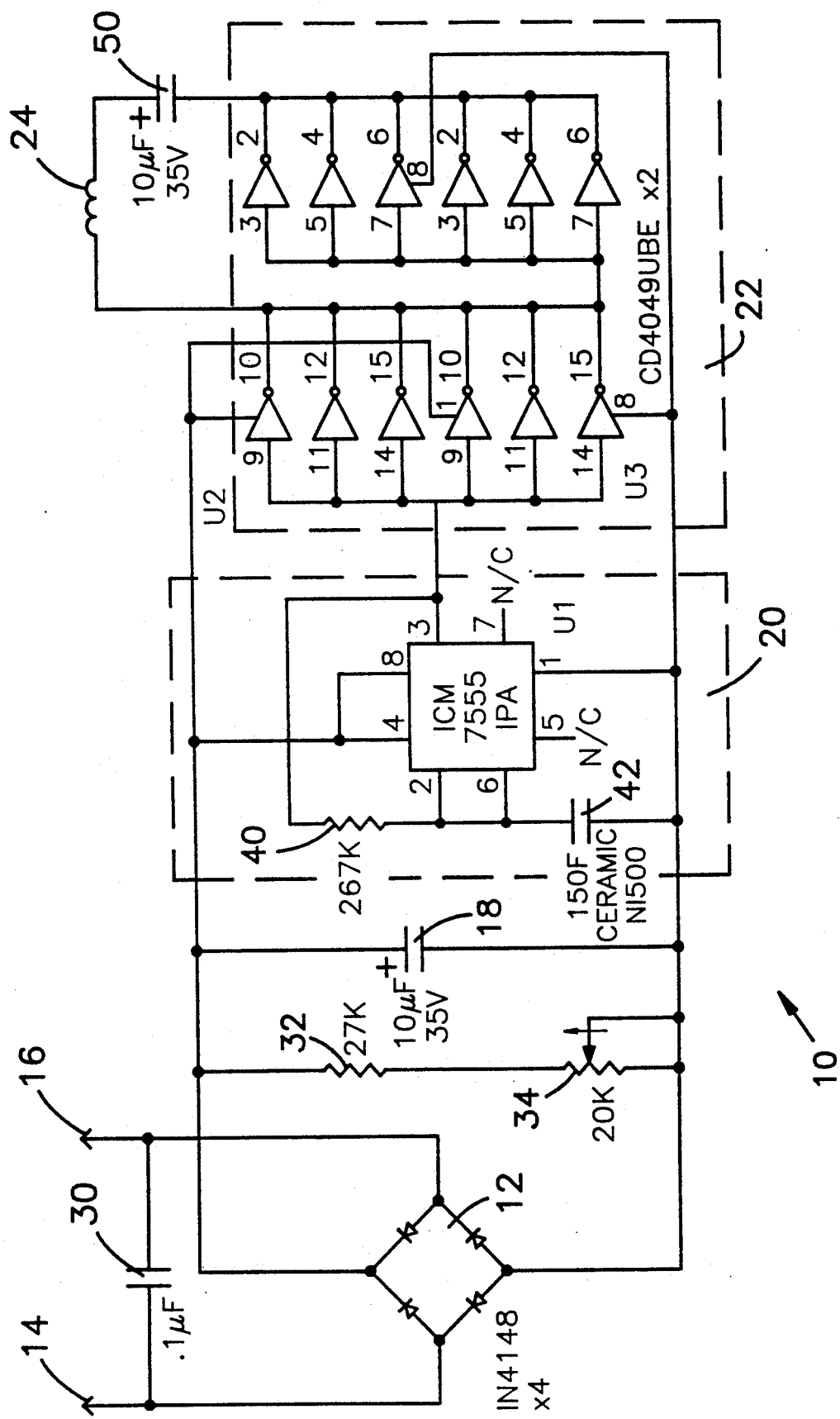
FIG. 2 is a schematic diagram of the proximity sensor of FIG. 1.

Referring now to FIG. 2, in the operation of proximity sensor 10, terminals 14 and 16 provide power to the sensor via diode bridge 12 which permits the sensor to be connected to the controller without regard to the polarity of the terminals. The output of diode bridge 12 constitutes the power source for the entire circuitry of sensor 10 and the current drawn from the controller comprises the "output" signal of the sensor. A capacitor 30 connected directly across terminals 14 and 16 serves to suppress any radio frequency pickup by the sensor. Capacitor 18 acts as a filter for the voltage supplied to sensor 10 and provides the instantaneous current required by driver 22. A resistor 32 and a trim potentiometer 34 allow trimming the overall quiescent current drain of sensor 10 to a standard value at the time of manufacture, compensating for variations in the supply current requirements of the components.

Oscillator 20 includes a low-power CMOS version of the well-known 555 timer, with a resistor 40 and a capacitor 42 constituting the timing components for the oscillator and setting the frequency of operation. The value of capacitor 42 is chosen as a compromise between being large compared to the stray capacitance of the (preferably) printed circuit and components, so that the frequency is well determined by the capacitor itself, but is otherwise as small as possible to minimize current drain in the oscillator and cost. The value of resistor 40 is then determined to give the desired operating frequency.

The output signal from oscillator 20 feeds driver 22 which comprises two banks of paralleled sections of CMOS inverting buffers. This configuration of driver 22 forms a full "H" bridge driver stage which applies a square wave bipolar voltage signal to sensing coil 24 with a peak-to-peak amplitude equal to twice the supply voltage, giving rise to a triangle current waveform in the coil. This mode of excitation of sensor coil 24 provides maximum current swing in the coil for a given supply voltage and frequency, which in turn maximizes the eddy current loss in plunger 26 and, hence, maximizing the output signal swing of sensor 10. A capacitor 50 in series with sensor coil 24 serves to block any DC current flow in the coil which would otherwise result from slight deviations of the oscillator duty cycle from its nominal 50 percent or from mismatches of the characteristics of the CMOS driver sections. DC current in coil 24 is undesirable because it causes an error term in the output from sensor 10. Since any DC voltage developed across capacitor 50 may be of either polarity, the capacitor must be of a type suitable for bipolar operation, at least at the voltages encountered.

To improve the stability of sensor 10 over a wide range of ambient temperatures, the following temperature compensation scheme is employed. Without temperature compensation, the output of sensor 10 would increase somewhat with temperature, primarily because increases in the resistances of the CMOS inverting buffers in driver 22 and of sensor coil 24 reduce the "Q" of the circuit as temperature rises. However, the output of sensor 10 can be made to change by varying the frequency at which oscillator 20 operates because the "Q" increases with frequency. Thus, by designing oscillator 20 to exhibit a positive temperature coefficient with frequency, a first order temperature compensation of sensor 10 can be obtained. The IC of oscillator 20 is quite temperature stable, so the desired characteristic is obtained by choosing capacitor 42 to be a type with an appropriate temperature coefficient of capacitance.

While design of the geometry of coil 24 is complicated because its size and shape affect the operation of sensor 10 in many interacting ways, once the overall dimensions are fixed, the design of the winding by conventional techniques is straightforward. Since the current in the coil is approximately a triangle wave with linear ramps, with the rate of change of current inversely proportional to the coil self inductance, for a given supply voltage and operating frequency this inductance directly determines the peak-to-peak current swing in the coil. This current swing is a basic design parameter of sensor 10, both because it greatly affects the eddy current loss in plunger 26, and because there are definite limits to how much current may be allowed to flow in the IC's of driver 22. Thus, once the supply voltage, operating frequency, and coil current are known, the coil inductance can be calculated by conventional techniques. From this inductance and the dimensions of the coil, a suitable wire size and number of turns for the coil can be determined by conventional techniques.

Figure 3:
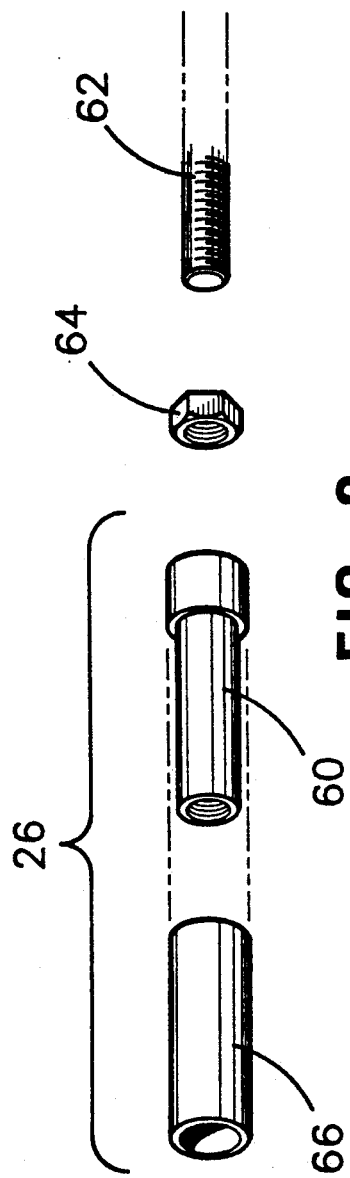
FIGS. 3 and 4 illustrate the construction of a core and a coil for use in the proximity sensor of FIG. 1.
Figure 4:
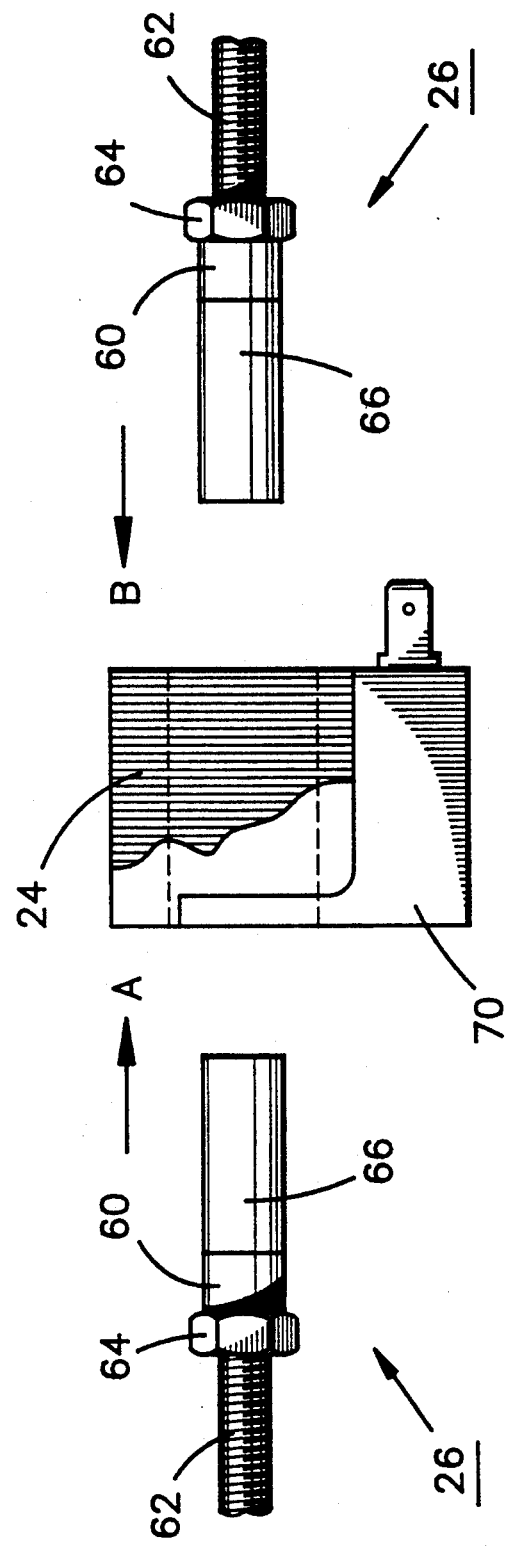
Figure 2:
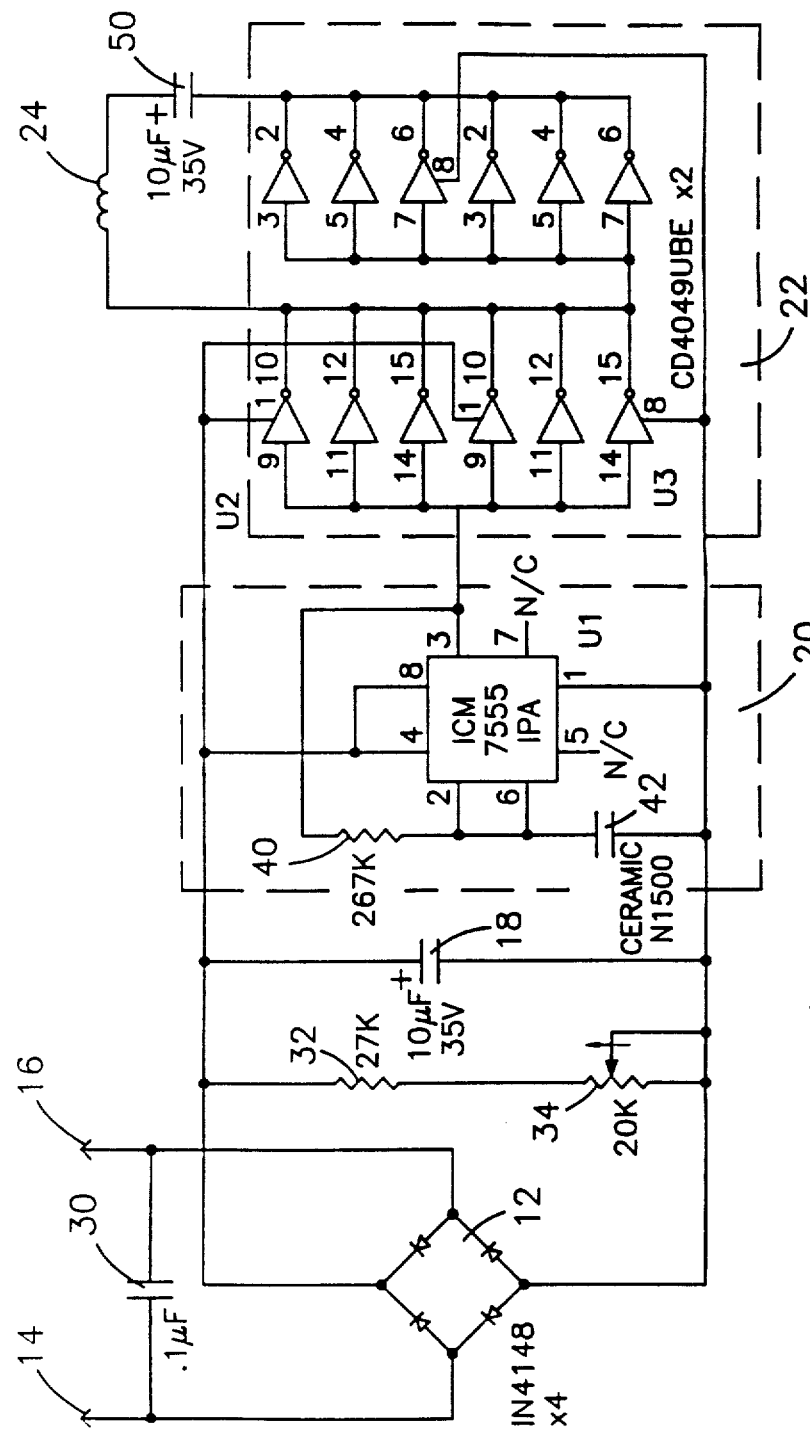

FIGS. 3 and 4 illustrate the construction of plunger 26 for use with sensing coil 24 when the coil is of the annular type. Plunger 26 includes a mild steel core 60, internally threaded for mounting on a threaded throttle linkage 62 and to be secured thereon by means of a locknut 64. Plunger 26 also includes a Type 304 stainless steel sleeve 66 fitted over a portion of core 60. Core 60 acts to concentrate the magnetic flux of coil 24 so that it passes through sleeve 66 which acts as a transformer turn. Coil 24 is wound on a nylon bobbin in housing 70.

Satisfactory performance for the configurations shown on FIGS. 3 and 4 is achieved when plunger 26 has a 0.500-inch OD, with sleeve 66 having a 0.028-inch wall thickness and a length of 1.00 inches, and with core 60 being about 1¼ inches long and being mounted on a 5/16-inch diameter throttle shaft 62. The nylon bobbin in housing 70 has a 0.670-inch diameter cylindrical passageway to axially accept the movement of plunger 26. Coil 24 comprises 920 turns of #30 AWG copper wire, having an ID of about 0.730 inch, an OD of about 0.986 inch, and a length of about 0.980 inch. The resulting coil inductance is about 10 milliHenrys and the DC resistance is about 21 Ohms. For use with the particular coil 24 and plunger 26 described, sensor 10 operates at a frequency of 16 kHz with a supply voltage of about 14 Volts.

For the configurations shown and the dimensions given above, plunger 26 may be advanced into coil 24 in either of the directions indicated by arrows "A" and "B" and, depending on the exact construction of housing 70, "start throttle" will be experienced at about 0.05 inch of insertion depth, while "full throttle" will be experienced at about 0.9 inch of insertion depth.

In general, the best performance is attained when the cross-sectional area of plunger 26 is a large fraction of the cross-sectional area of the passageway in the bobbin in which it is inserted. On the other hand, the large fraction must be balanced by the need to have sufficient clearance to make mechanical linkages easier to manufacture and maintain and to avoid the affects of environmental dirt and dust. Mild steel is the preferable material for core 60, because of low cost and easy manufacturability, although other ferromagnetic materials may be employed. Sleeve 66 should be a relatively high resistivity metal and brass and stainless steel are preferable materials because of cost and corrosion resistance considerations. The thickness of sleeve 66 is critical, since thinner or thicker walls than the optimum for a particular configuration decrease the output swing of sensor 10.

Again, other configurations of the inductor coil and associated moving metal may be employed within the intent of the present invention and the construction details thereof will be readily apparent to those skilled in the art.

It will thus be seen that the objects set forth above, among those made apparent from the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:
1. A proximity sensor, comprising:
  (a) inductor means;
  (b) excitation means to provide an alternating bipolar square-wave current to said inductor means to produce magnetic energy therein;
  (c) a moving member movable in proximity to said inductor means to produce losses in said magnetic energy; and
  (d) means to provide an output from said sensor proportional to said losses.
2. A proximity sensor, as defined in claim 1, wherein said square-wave current to said inductor is produced by an "H" bridge driver.
3. A proximity sensor, as defined in claim 1, wherein said moving member comprises:
  (a) a ferromagnetic core; and
  (b) a relatively thin sleeve of a relatively high resistivity metal disposed upon said core.

4. A proximity sensor, as defined in claim 3, wherein said core is constructed from mild steel and said sleeve is constructed from stainless steel or brass.

5. A temperature compensated proximity sensor, comprising:
   (a) inductor means;
   (b) excitation means to provide a bipolar square-wave alternating current to said inductor means to produce magnetic energy therein, said excitation means comprising:
      (i) input means to receive a DC voltage;
      (ii) driver means to provide said alternating current to said inductor; and
      (iii) oscillator means, having a positive temperature coefficient with frequency, connected to said input means and connected to provide an input to said driver means;
   (c) a moving member movable in proximity to said inductor means to produce losses in said magnetic energy; and
   (d) means to provide an output from said sensor proportional to said losses.

6. A method of measuring the proximity of a moving member to an inductor, comprising:
   (a) exciting said inductor with an alternating bipolar square-wave current to said inductor means to produce magnetic energy therein; and
   (b) measuring losses in said magnetic energy caused by the proximity of said moving member to said inductor means, the magnitude of said losses indicating the position of said moving member.

7. A method, as defined in claim 6, further comprising providing said square-wave current to said inductor with an "H" driver bridge.

8. A method of measuring the proximity of a moving member to an inductor, as defined in claim 6, further providing said moving member comprising:
   (a) a ferromagnetic core; and
   (b) a relatively thin sleeve of a relatively high resistivity metal disposed upon said core.

9. A method, as defined in claim 8, further comprising providing said core constructed from mild steel and providing said sleeve constructed from stainless steel or brass.

10. A method of measuring the proximity of a moving member to an inductor, comprising:
    (a) exciting said inductor with a bipolar square-wave alternating current to produce magnetic energy therein by providing:
       (i) input means to receive a DC voltage;
       (ii) driver means to provide said bipolar alternating current to said inductor; and
       (iii) oscillator means, having a positive temperature coefficient with frequency, connected to said input means and connected to provide an input to said driver means; and
    (b) measuring loses in said magnetic energy caused by the proximity of said moving member to said inductor, the magnitude of said losses indicating the position of said moving member.

11. A proximity sensor, as defined in claim 1, wherein said means to provide an output from said sensor proportional to said losses comprises means to measure the current drawn by said sensor.

12. A proximity sensor, as defined in claim 5, wherein said means to provide an output from said sensor proportional to said losses comprises means to measure the current drawn by said sensor.

13. A proximity sensor, as defined in claim 1, wherein said inductor is operatively connected to the throttle of a vehicle.

14. A proximity sensor, as defined in claim 5, wherein said inductor is operatively connected to the throttle of a vehicle.

15. A method, as defined in claim 6, wherein said step of measuring losses comprises measuring the current drawn by the components of element (a).

* * * * *

UNITED STATES PATENT AND TRADEMARK OFFICE
CERTIFICATE OF CORRECTION

PATENT NO. : 5,247,253

DATED : September 21, 1993

INVENTOR(S) : Scott A. Bowman

Page 1 of 3

It is certified that error appears in the above-indentified patent and that said Letters Patent is hereby corrected as shown below:

Title page, showing an illustrative figure, should be deleted and substitute therfor the attached title page.

In the Drawings; delete drawing sheet 2 of 3 and substitute therefor the Drawing sheet, consisting of Fig. 2, as shown on the attached page.

Signed and Sealed this

Nineteenth Day of July, 1994

*Attest:*

BRUCE LEHMAN

*Attesting Officer*     *Commissioner of Patents and Trademarks*

United States Patent [19]
Bowman

[11] Patent Number: 5,247,253
[45] Date of Patent: Sep. 21, 1993

[54] EDDY CURRENT PROXIMITY SENSING MEANS AND METHOD USEFUL FOR DETERMINING THROTTLE POSITION

[75] Inventor: Scott A. Bowman, San Anselmo, Calif.

[73] Assignee: Curtis Instruments, Inc., Mt. Kisco, N.Y.

[21] Appl. No.: 611,073

[22] Filed: Nov. 9, 1990

[51] Int. Cl.$^5$ .............................................. G01B 7/14
[52] U.S. Cl. .............................. 324/207.12; 324/225; 324/207.16
[58] Field of Search .................. 324/207.16, 207.18, 324/207.19, 207.24, 207.12, 224, 225, 222

[56] References Cited
U.S. PATENT DOCUMENTS 3,926,053 12/1975 Schurrer et al. ............ 324/207.12 X
4,502,006 2/1985 Goodwin et al. ............... 324/207.16
4,779,048 10/1988 Aichele .......................... 324/207.18
4,797,614 1/1989 Nelson ............................ 324/224 X
4,950,985 8/1990 Voss et al. ...................... 324/207.16

Primary Examiner—Gerard R. Strecker
Assistant Examiner—Warren S. Edmonds
Attorney, Agent, or Firm—John H. Crozier

[57] ABSTRACT

In a preferred embodiment, an inductor excited by a square-wave alternating current to produce a magnetic field in the inductor. A member movable in proximity to the inductor causes losses in the magnetic energy, which losses are directly related to the position of the member with respect to the coil. In another aspect of the invention, there is provided an inductor excited by an alternating current and a moving member which includes a ferromagnetic core having disposed thereon a thin sleeve of high resistivity material. In a further aspect of the invention, there is provided an inductor excited by an alternating current and a moving member, the excitation circuit including an oscillator having a positive temperature coefficient of frequency.

15 Claims, 3 Drawing Sheets

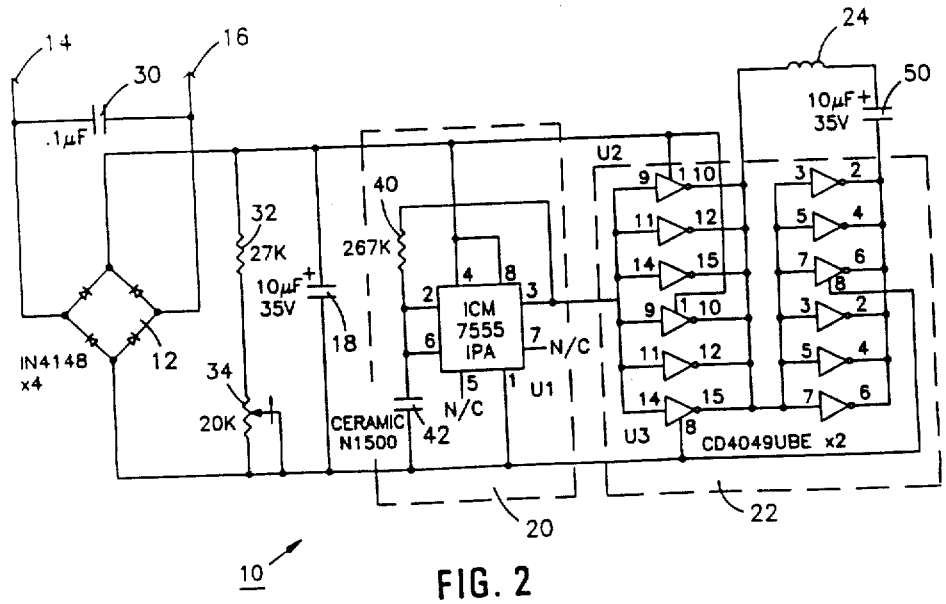

FIG. 2